(12) United States Patent
Kim et al.

(10) Patent No.: US 10,731,250 B2
(45) Date of Patent: Aug. 4, 2020

(54) DEPOSITING RUTHENIUM LAYERS IN INTERCONNECT METALLIZATION

(71) Applicant: Lam Research Corporation, Fremont, CA (US)

(72) Inventors: Do Young Kim, Albany, CA (US); Jeong-Seok Na, San Jose, CA (US); Chiukin Steven Lai, Sunnyvale, CA (US); Raashina Humayun, Los Altos, CA (US); Michal Danek, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 53 days.

(21) Appl. No.: 15/996,925

(22) Filed: Jun. 4, 2018

(65) Prior Publication Data

US 2018/0347041 A1 Dec. 6, 2018

Related U.S. Application Data

(60) Provisional application No. 62/515,894, filed on Jun. 6, 2017.

(51) Int. Cl.
*C23C 16/455* (2006.01)
*C23C 16/18* (2006.01)
(Continued)

(52) U.S. Cl.
CPC ........ *C23C 16/45534* (2013.01); *C23C 16/18* (2013.01); *C23C 16/4486* (2013.01); *C23C 16/45536* (2013.01); *C23C 16/45542* (2013.01); *C23C 16/45553* (2013.01); *C23C 16/5096* (2013.01); *C23C 16/52* (2013.01); *C23C 16/54* (2013.01); *H01L 21/0228* (2013.01); *H01L 21/02274* (2013.01); *H01L 21/28562* (2013.01); *H01L 21/76843* (2013.01);
(Continued)

(58) Field of Classification Search
CPC ........ C23C 16/45525; C23C 16/45534; C23C 16/45536; C23C 16/45553; H01L 21/02274; H01L 21/0228; H01L 21/76843; H01L 21/76876; H01L 21/76877
See application file for complete search history.

(56) References Cited

U.S. PATENT DOCUMENTS 6,063,705 A 5/2000 Vaartstra
6,153,519 A 11/2000 Jain et al.
(Continued)

OTHER PUBLICATIONS

Wen, Liang Gong, et al., "Atomic Layer Deposition of Ruthenium with TiN Interface for Sub-10 nm Advanced Interconnects beyond Copper". ACS Appl. Mater. Interfaces 2016, 8, 26119-26125.*
(Continued)

*Primary Examiner* — Bret P Chen
(74) *Attorney, Agent, or Firm* — Weaver Austin Villeneuve & Sampson LLP

(57) ABSTRACT

In some embodiments, deposition processes for ruthenium (Ru) feature fill include deposition of a thin, protective Ru film under reducing conditions, followed by a Ru fill step under oxidizing conditions. The presence of protective Ru films formed under oxygen-free conditions or with an oxygen-removing operation can enable Ru fill without oxidation of an underlying adhesion layer or metal feature.

25 Claims, 10 Drawing Sheets

(51) Int. Cl.
*H01L 23/532* (2006.01)
*H01L 21/02* (2006.01)
*H01L 21/768* (2006.01)
*C23C 16/54* (2006.01)
*H01L 23/522* (2006.01)
*C23C 16/509* (2006.01)
*H01L 21/285* (2006.01)
*C23C 16/448* (2006.01)
*C23C 16/52* (2006.01)

(52) U.S. Cl.
CPC .. *H01L 21/76876* (2013.01); *H01L 21/76877* (2013.01); *H01L 23/5226* (2013.01); *H01L 23/53238* (2013.01); *H01L 23/53252* (2013.01); *H01L 23/53266* (2013.01); *H01L 23/53209* (2013.01)

(56) References Cited

U.S. PATENT DOCUMENTS

| | | | |
|---|---|---|---|
| 6,265,311 B1 | 7/2001 | Hautala et al. | |
| 6,323,131 B1 | 11/2001 | Obeng et al. | |
| 6,348,376 B2 | 2/2002 | Lim et al. | |
| 6,416,822 B1 | 7/2002 | Chiang et al. | |
| 6,417,115 B1 | 7/2002 | McDevitt et al. | |
| 6,428,859 B1 | 8/2002 | Chiang et al. | |
| 6,576,345 B1 | 6/2003 | Van Cleemput et al. | |
| 6,844,258 B1 | 1/2005 | Fair et al. | |
| 6,949,450 B2 | 9/2005 | Chiang et al. | |
| 6,989,599 B1 | 1/2006 | Iwasaki et al. | |
| 7,047,719 B2* | 5/2006 | Dubois | A01F 15/101 |
| | | | 100/50 |
| 7,157,798 B1 | 1/2007 | Fair et al. | |
| 7,211,509 B1 | 5/2007 | Gopinath et al. | |
| 7,279,417 B1 | 10/2007 | Dalton et al. | |
| 7,456,101 B1 | 11/2008 | Gopinath et al. | |
| 9,371,579 B2 | 6/2016 | Varadarajan et al. | |
| 9,677,172 B2* | 6/2017 | Ha | C23C 16/045 |
| 2001/0043453 A1 | 11/2001 | Narwandar et al. | |
| 2002/0045310 A1 | 4/2002 | Iijima et al. | |
| 2002/0068458 A1 | 6/2002 | Chiang et al. | |
| 2002/0104481 A1 | 8/2002 | Chiang et al. | |
| 2002/0172768 A1 | 11/2002 | Endo et al. | |
| 2002/0173054 A1 | 11/2002 | Kim | |
| 2002/0197402 A1 | 12/2002 | Chiang et al. | |
| 2003/0045094 A1* | 3/2003 | Itatani | C23C 16/0272 |
| | | | 438/686 |
| 2003/0108674 A1 | 6/2003 | Chung et al. | |
| 2004/0105934 A1 | 6/2004 | Chang et al. | |
| 2004/0214354 A1 | 10/2004 | Marsh et al. | |
| 2004/0221798 A1 | 11/2004 | Sherman | |
| 2004/0232552 A1 | 11/2004 | Wang et al. | |
| 2005/0118807 A1 | 6/2005 | Kim et al. | |
| 2005/0227003 A1 | 10/2005 | Carlson et al. | |
| 2005/0238808 A1* | 10/2005 | Gatineau | C23C 16/06 |
| | | | 427/248.1 |
| 2006/0093848 A1 | 5/2006 | Senkevich et al. | |
| 2006/0128150 A1 | 6/2006 | Gandikota et al. | |
| 2006/0177601 A1* | 8/2006 | Park | C23C 16/18 |
| | | | 427/576 |
| 2006/0208215 A1 | 9/2006 | Metzner et al. | |
| 2007/0069383 A1* | 3/2007 | Suzuki | C23C 16/16 |
| | | | 257/751 |
| 2007/0096321 A1 | 5/2007 | Raaijmakers et al. | |
| 2007/0190782 A1* | 8/2007 | Park | C23C 16/18 |
| | | | 438/686 |
| 2007/0246792 A1 | 10/2007 | Yang et al. | |
| 2007/0292603 A1* | 12/2007 | Dordi | H01L 21/0206 |
| | | | 427/98.1 |
| 2008/0057198 A1* | 3/2008 | Yoon | H01L 21/0206 |
| | | | 427/250 |
| 2008/0146042 A1* | 6/2008 | Kostamo | C23C 16/40 |
| | | | 438/778 |
| 2008/0169565 A1 | 7/2008 | Bonilla et al. | |
| 2008/0254232 A1* | 10/2008 | Gordon | C07C 211/65 |
| | | | 427/585 |
| 2008/0261412 A1* | 10/2008 | Yoon | C23C 16/45551 |
| | | | 438/785 |
| 2009/0104777 A1* | 4/2009 | Kim | C23C 16/40 |
| | | | 438/686 |
| 2011/0111533 A1 | 5/2011 | Varadarajan et al. | |
| 2011/0117678 A1 | 5/2011 | Varadarajan et al. | |
| 2011/0198756 A1* | 8/2011 | Thenappan | C07F 17/02 |
| | | | 257/751 |
| 2012/0028474 A1 | 2/2012 | Kostamo et al. | |
| 2014/0287577 A1* | 9/2014 | Emesh | H01L 21/76879 |
| | | | 438/618 |
| 2015/0056384 A1 | 2/2015 | Gatineau et al. | |
| 2015/0303063 A1* | 10/2015 | Tada | C07F 15/0046 |
| | | | 438/681 |
| 2016/0148945 A1* | 5/2016 | Sharangpani | H01L 27/11556 |
| | | | 257/321 |
| 2018/0096888 A1* | 4/2018 | Naik | H01L 21/28562 |

OTHER PUBLICATIONS

McCoy, A.P., et al., "The addition of aluminium to ruthenium liner layers for use as copper diffusion barriers". Applied Surface Science 307 (2014) 677-681.*

Austin, Dustin, Z., et al., "Atomic Layer Deposition of Ruthenium and Ruthenium Oxide Using a Zero-Oxidation State Precursor". Chem. Mater. 2017, 29, 1107-1115.*

Popovici, Mihaela, et al., "Atomic Layer Deposition of Ruthenium Thin Films from (Ethylbenzyl) (1-Ethyl-1,4-cyclohexadienyl) Ru: Process Characteristics, Surface Chemistry, and Film Properties". Chem. Mater. 2017, 29, 4654-4666.*

Song, Y.W., et al., "Atomic Layer Deposition of Ru by Using a New Ru-precursor". ECS Transactions, 2 (4) 1-11 (2006).*

Wen, Liang Gong, et al., "Ruthenium Metallization for Advanced Interconnects". 2016 IEEE International Interconnect Technology Conference / Advanced Metallization Conference (IITC/AMC), May 23-26, 2016, pp. 34-36.*

U.S. Office Action, dated Aug. 24, 2006, issued in U.S. Appl. No. 10/868,384 [NOVLP095].

U.S. Notice of Allowance, dated Dec. 13, 2006, issued in U.S. Appl. No. 10/868,384 [NOVLP095].

U.S. Office Action, dated Apr. 7, 2008, issued in U.S. Appl. No. 11/724,091 [NOVLP095D1].

U.S. Notice of Allowance, dated Jul. 25, 2008, issued in U.S. Appl. No. 11/724,091 [NOVLP095D1].

Aloha, Air Liquide Electronics, "RuEtCp2," *Aloha™ CVD/ALD Materials*, 2 pages.

Austin, D. et al., "Atomic Layer Deposition of Ruthenium and Ruthenium Oxide Using a Zero-Oxidation State Precursor," Chem Mater. 2017, 29(3), pp. 1107-1115.

Becker et al. (2003) "Highly Conformal Thin Films of Tungsten Nitride Prepared by Atomic Layer Deposition from a Novel Precursor," *Chem. Mater*, 15(15):2969-2976.

Becker et al. (Apr. 7, 2003) "Diffusion barrier properties of tungsten nitride films grown by atomic layer deposition from bis(tert-butylimido)bis(dimethylamido) tungsten and ammonia," *Applied Physics Letters*, 82(14):2239-2241.

Cao, L.F. et al. (2006) "Thermal stability of Fe, Co, Ni metal nanoparticles," *phys. Stat. sol. (b)* 243(12):2745-2755.

Chen, Shaowei et al. (1999) "Electrochemical Quantized Capacitance Charging of Surface Ensembles of Gold Nanoparticles," *J. Phys. Chem. B*, 103(45):9996-10000.

Chen, Wei et al. (2006) "Carbene-Functionalized Ruthenium Nanoparticles," *Chem. Mater*, 18:5253-5259.

Cheng, Guangjun et al. (Dec. 20, 2005) "Magnetic-Field-Induced Assemblies of Cobalt Nanoparticles," *Langmuir The ACS Journal of Surfaces and Colloids, American Chemical Society*, 21(26):12055-12059.

Chirea, M. et al. (2005) "Electrochemical Characterization of Polyelectrolyte/Gold Nanoparticle Multilayers Self-Assembled on Gold Electrodes," *J. Phys. Chem. B*, 109(46):21808-21817.

(56) References Cited

OTHER PUBLICATIONS

Chiu et al. (Jun. 1993) "Tungsten nitride thin films prepared by MOCVD," *J. Mater. Res.*, 8(6):1353-1360.
Choi, et al., (2011) "Thermal Atomic Layer Deposition (ALD) of Ru Films for Cu Direct Plating," Journal of The Electrochemical Society, vol. 158, No. 6, pp. D351-D356.
Crane et al. (2001) "Kinetic and Mechanistic Studies of the Chemical Vapor Deposition of Tungsten Nitride from Bis(Tertbutylimido)Bis(Tertbutylamido) Tungsten," *J. Phys. Chem. B*, 105(17):3549-3556.
Davis, J.A., et al., "Interconnect Limits on Gigascale Integration (GSI) in the 21st Century," Proc. IEEE, Mar. 2001, 89(3) pp. 305-324.
Farmer, et al., (2007) "High density Ru noncrystal deposition for nonvolatile memory applications," Journal of Applied Physics, vol. 101, pp. 124503-1-124503-5.
Gatineau, et al., (2007) "A New Liquid Precursor for Pure Ruthenium Depositions," ECS Transactions, vol. 6, No. 1, The Electrochemical Society, pp. 303-307.
Gaur, R., et al., "Ruthenium complexes as precursors for Chemical Vapor-Deposition (CVD)," RSC Adv., 4, 2014, pp. 33785-33805.
Hamalainen, J., et al., "Atomic Layer Deposition of Noble Metals and Their Oxides," Chem. Mater., 2014, 26, pp. 786-801.
Hong, et al. (2013) "Atomic Layer Deposition of Ru Thin Films Using a Ru(0) Metallorganic Precursor and O2" ECS Journal of Solid State Science and Technology, vol. 2, No. 3, pp. P47-P53.
Hu, C.K. et al. (Jun. 14, 2004) "Atom motion of Cu and Co in Cu damascene lines with a CoWP cap," *Applied Physics Letters, American Institute of Physics*, 84(24):4986-4988.
Kapur, P., et al., "Technology and Reliability Constrained Future Copper Interconnects—Part I. Resistance Modeling," IEEE Trans Electron Devices, 2002, 49(4), pp. 590-597.
Kim et al. (2003) "Characteristics of Tungsten Carbide Films Prepared by Plasma-Assisted ALD Using Bis(tert-butylimido)bis(dimethylamido)tungsten," *Journal of The Electrochemical Society*, 150(10):C740-C744.
Kwon, Oh-Kyum et al. (2004) "PEALD of a Ruthenium Adhesion Layer for Copper Interconnects," *Journal of The Electrochemical Society*, 151(12): C753-C756.
Lee, et al. (2006) "Preparation of monodisperse Co and Fe nanoparticle using precursor of $M^{2+}$ -oleate$_2$ (M = Co, Fe)," *Current Applied Physics* 6:786-790.
Lee, et al., (2016) "Plasma-free atomic layer deposition of Ru thin Films using H2 molecules as a nonoxidizing reactant," Journal of Vacuum Science & Technology A: Vacuum, Surfaces, and Films, vol. 34, No. 3, Apr. 18, 2016, pp. 031509-1-031509-7.
Leick, et al., (2011) "Atomic layer deposition of Ru from CpRu(CO)$_2$Et using O$_2$ gas and O$_2$ plasma," J. Vac. Sci. Technol. A., vol. 29, No. 2, Mar./Apr. 2011, pp. 021016-1-021016-7.
Leick, N., et al. "Dehydrogenation Reactions during Atomic Layer Deposition of Ru Using O2," Chem. Mater., 2012, 24, pp. 3696-3700.
Li, et al.,(2007) "Vapor Deposition of Ruthenium from an Amidinate Precursor," Journal of The Electrochemical Society, vol. 154, No. 12, pp. D642-D647.
Lu., J., et al., "Low Temperature ABC-Type Ru Atomic Layer Deposition through Consecutive Dissociative Chemisorption, Combustion, and Reduction Steps," Chem. Mater., 2015, 27 (14), pp. 4950-4956.
Markov, I. L., "Limits on fundamental limits to computation," Nature, Aug. 14, 2014, 512, pp. 147-154.
Pan, C. et al., "A Proposal for a Novel Hybrid Interconnect Technology for the End of Roadmap" IEEE, Electron Device Lett., Apr. 2014, 35(2), pp. 250-252.
Park, et al., (2008) "Thermal and plasma enhanced atomic layer deposition ruthenium and electrical characterization as a metal electrode," Microelectronic Engineering, vol. 85, Elsevier, pp. 39-44.
Pardo-Yissar, V. et al. (2001) "Layered Polyelectrolyte Films on Au Electrodes: Characterization of Electron-Transfer Features at the Charged Polymer Interface and Application for Selective Redox Reactions," *American Chemical Society, Langmuir 2001*, 17(4):1110-1118.
Sari, et al., (2011) "Plasma Enhanced Atomic Layer Deposition of Ruthenium Thin Films Using Isopropylmethylbenzene-Cyclohexadiene-Rutheniun and NH3 Plasma," Journal of The Electrochemical Society, vol. 158, No. 1, pp. D42-D47.
Sondheimer, E.H., "The Mean Free Path of Electrons in Metals," Adv. Phys., 2001, 50(6), pp. 499-537.
Tsai, et al. (1996) "Metalorganic chemical vapor deposition of tungsten nitride for advanced metallization," *Appl. Phys. Lett.* 68(10), Mar. 4, 1996, 1412-1414.
Wen, et al., (2016) "Atomic Layer Deposition of Ruthenium with TiN Interface for Sub-10 nm Advanced Interconnects beyond Copper," ACS Appl. Mater. Interfaces, pp. 26119-26125.
Wu et al. (Sep./Oct. 2003) "Surface reaction of bis(tertbutylimido) bis(diethylamido)tungsten precursor on Si(100)—(2X1)," *J. Vac. Sci. Technol. A* 21(5):1620-1624.
Yim, Sung-Soo, et al. "Nucleation Kinetics of Ru on Silicon Oxide and Silicon Nitride Surfaces Deposited by Atomic Layer Deposition," Journal of Applied Physics, 103, 113509, 2008 10 pages.
Zimmerman, C.G. et al. (Aug. 9, 1999) "Burrowing of Co Nanoparticles on Clean Cu and Ag Surfaces," *Physical Review Letters, The American Physical Society*, 83(6):1163-1166.
U.S. Appl. No. 12/044,918, filed Mar. 7, 2008, Alers et al.
U.S. Office Action, dated Jun. 22, 2009, issued in U.S. Appl. No. 12/044,918 [NOVLP222].
U.S. Final Office Action, dated Jan. 25, 2010, issued in U.S. Appl. No. 12/044,918 [NOVLP222].
U.S. Office Action, dated Dec. 29, 2008, issued in U.S. Appl. No. 11/540,937 [NOVLP175].
Final Office Action, dated Jul. 22, 2009, issued in U.S. Appl. No. 11/540,937 [NOVLP175].
International Search Report and Written Opinion dated Sep. 21, 2018, issued in Application No. PCT/US2018/036144.
U.S. Appl. No. 11/540,937, filed Sep. 29, 2006, Gopinath et al.

\* cited by examiner

DEPOSITING RUTHENIUM LAYERS IN INTERCONNECT METALLIZATION

CROSS-REFERENCE TO RELATED APPLICATION

This application claims priority under 35 USC § 119(e) to U.S. Provisional Patent Application No. 62/515,894, filed Jun. 6, 2017, which is incorporated by reference herein in its entirety and for all purposes.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In semiconductor fabrication, features may be filled with conductive materials. For example, copper is used for back end of line (BEOL) interconnects. However, copper interconnects are challenging to fabricate in sub-10 nm technology nodes. Deposition of copper interconnects often involves first depositing a barrier layer to prevent interdiffusion of elements from copper interconnects and substrate layers. However, a barrier material that maintains its integrity as its thickness is scaled below 2.5 nm has not been identified. As the linewidth scales to 10 nm (at the 5 nm technology node), the barrier will consume 5 nm of the linewidth and more than 50% of the line cross-section, increasing the resistance exponentially with each technology node beyond 10 nm. Additionally, copper has an electron mean free path of about 39 nm. As a result, in small critical dimension features, electrons hit the sidewalls resulting in a less elastic collision.

SUMMARY

One aspect of the disclosure relates to a method including receiving a substrate including a feature; performing multiple atomic layer deposition (ALD) cycles to deposit a ruthenium (Ru) liner layer in the feature, wherein each of the ALD cycles include a dose of a reducing agent; and after depositing the Ru liner layer, at least partially filling the feature with ruthenium by reacting a first ruthenium precursor with an oxidant.

In some embodiments, each of the multiple ALD cycles includes reacting a second ruthenium precursor with the reducing agent, the second ruthenium precursor being different than the first ruthenium precursor.

In some embodiments, each of the multiple ALD cycles include reacting the first ruthenium precursor with the reducing agent. In some such embodiments, the first ruthenium precursor has a Ru center at non-zero oxidation state.

According to various embodiments, the ALD cycles may be thermal ALD cycles or plasma enhanced ALD (PEALD) cycles. In some embodiments, the reducing agent is H2 or NH3 or plasma species generated from H2 or NH3.

In some embodiments, the oxidant is O2, O3, or H2O. In some embodiments, each of the multiple ALD cycles involves reacting the first ruthenium precursor with an oxidant, such that the same Ru precursor is used to deposit the Ru liner layer and in the subsequent fill operation.

In some embodiments, the dose of the reducing agent removes oxygen incorporated into the Ru liner layer or an underlying metallic layer.

In some embodiments, the feature is fully filled with Ru. In some embodiments, the feature is fully filled with a metal selected from Cu, W, Co, Mo, Ni, and Al.

In some embodiments, each of the multiple ALD cycles comprises a ruthenium precursor dose followed by an oxidant dose. In some such embodiments, the ruthenium precursor dose and oxidant dose are non-plasma doses. The multiple ALD cycles may further include a reducing plasma dose after the oxidant dose. In some such embodiments, there is no purge the between oxidant dose and the reducing plasma dose. In some embodiments, the oxidant dose is a mixture of an oxidant and a reducing agent.

In some embodiments, the thickness of the Ru liner layer is 2 nm or less.

In some embodiments, the feature includes a first liner layer on which the Ru liner is deposited. The liner layer may be a barrier or adhesion layer for example. In particular examples, the Ru liner layer may deposited on a liner layer selected from tungsten carbon nitride (WCN), titanium nitride (TiN), tungsten nitride (WN), tungsten carbide (WC), and tantalum nitride (TaN).

Another aspect of the disclosure relates to an apparatus including one or more process chambers each configured to hold a substrate; one or more process gas inlets for coupling to a ruthenium (Ru) precursor source, an oxidant gas source, and a reducing agent gas source; and a controller for controlling operations in the apparatus, comprising machine-readable instructions for performing multiple Ru liner deposition cycles, wherein instructions for each Ru liner deposition cycle include: instructions for inletting a Ru precursor dose to the one or more process chambers via the one more process gas inlets; instructions for, after inletting the Ru precursor, inletting an oxidant gas dose to the one or more process chambers via the one or more process gas inlets; and instructions for, after inletting the oxidant gas pulse, inletting a reducing agent gas dose to the one or more process chambers via the one or more process gas inlets.

In some embodiments, the controller further includes machine-readable instructions for performing a Ru fill process comprising instructions for, after the multiple Ru liner deposition cycles, inletting a second Ru precursor and an oxidant to the one or more process chambers.

In some embodiments, the apparatus includes a plasma generator wherein instructions for each Ru liner deposition cycle include generating a plasma from the reducing agent gas.

These and other aspects are described further below with reference to the figures.

DESCRIPTION

Provided are methods of forming ruthenium (Ru) films. The Ru films may be deposited in semiconductor substrate features such as vias and trenches as liner layers and feature fill. Applications include sub-10 nm node middle of line (MOL) and back end of line (BEOL) logic interconnects. In one example, the methods may be used for source/drain contact fill. Ruthenium has a short inelastic mean free path, allowing it to scale in resistivity at sub-10 nm dimensions better than materials like copper. Moreover, in some embodiments, it can be implemented without a diffusion barrier layer, which yields a larger cross-section of high conductivity material.

Provided are deposition processes including deposition of a thin, protective Ru film under reducing conditions, followed by a Ru fill step under oxidizing conditions. The presence of protective Ru films formed under oxygen-free conditions or with an oxygen-removing operation can enable Ru fill without oxidation of the underlying adhesion layer and metal substrate. The protective Ru layer can also serve as a barrier layer, preventing oxygen in the subsequent Ru fill step from penetrating into underlying metal layers. The Ru protective film deposited under reducing conditions is thin enough (e.g., 1-2 nm) such that the overall advantage of Ru interconnect is not compromised by potential impurities incurred in the first step.

According to various embodiments, a protective Ru layer may be formed by one of two embodiments, the first of which involves cycling oxidation-reduction chemistries and the second of which involves a reduction chemistry only with no oxidation chemistry. The former approach forms Ru films by cycling Ru deposition under oxidizing conditions and thermal or plasma treatment with reducing gases (e.g. $H_2$ or $NH_3$). The Ru film deposition using oxidizing gas reactants affords high purity Ru films. This step, however, can potentially oxidize underlying metal layers when the oxidizing reactants are not well controlled, with oxygen penetrating into underlying layers. A subsequent thermal or plasma treatment with reducing gases promotes the conversion of oxidized underlying metal layers back to their oxygen-free compositions. These growth cycles for protective Ru film ensure high purity Ru films without forming oxidized interface at the end of each cycle.

In another embodiment, forming a protective Ru layer involves reduction of a Ru precursor with reducing gases (e.g. $H_2$ or $NH_3$) under thermal or plasma deposition conditions. This method makes the preparation of protective layers simpler than the former cyclic approach. However, it may involve the use of two different precursor chemistries in the hybrid deposition steps, one for deposition of the protective Ru layer and another for subsequent feature fill.

Figure 1:
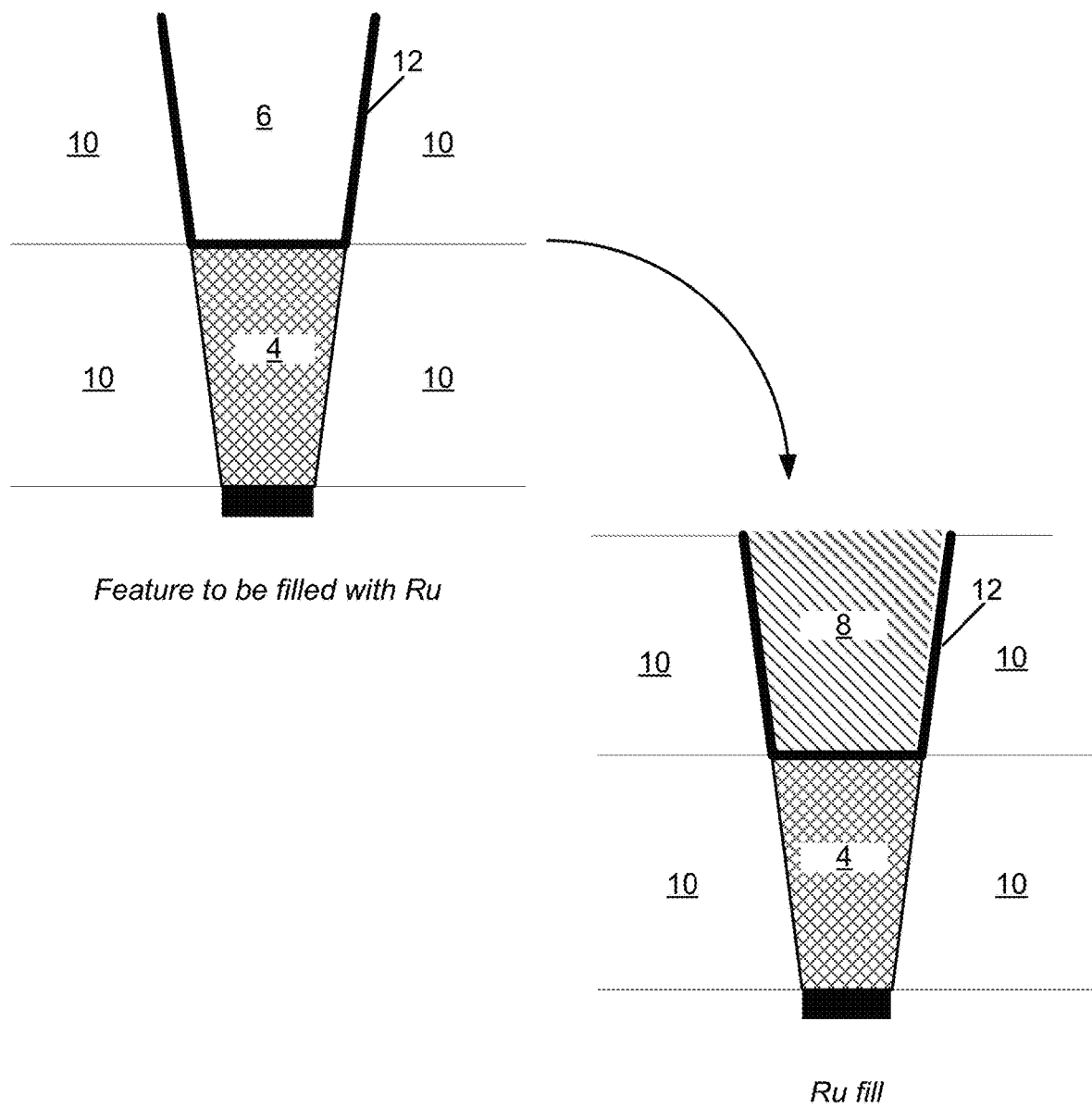
FIG. 1 shows an example of feature fill with ruthenium according to certain embodiments.

Feature fill using these methods is described further below with reference to FIGS. 1-4G. FIG. 1 shows an example of feature fill with ruthenium according to certain embodiments. An unfilled feature 6 is formed in a dielectric material 10. Examples of dielectric materials include oxides of tetraethyl orthosilicate (TEOS) or from other alkoxides, fluorosilicate glass (FSG), flowable oxides, spin-on-glasses, carbon doped oxides, nitrides, and oxynitrides. In some embodiments, the dielectric material may be a silicon-based oxide, nitride, or oxynitride. In the example of FIG. 1, the unfilled feature overlays a conductive material 4. The conductive material 4 may be any appropriate material with examples including tungsten (W), cobalt (Co), and ruthenium (Ru). A liner layer 12 may line the unfilled feature 6 and provide one or both of adhesion and diffusion barrier properties. Examples of materials for liner layer 12 include tungsten carbon nitride (WCN), titanium nitride (TiN), tungsten nitride (WN), tungsten carbide (WC), and tantalum nitride (TaN). The unfilled feature 6 may be filled with ruthenium to form a Ru interconnect 8. Methods of depositing ruthenium according to various embodiments are described further below with reference to FIGS. 2 and 4A-4G.

Figure 2:
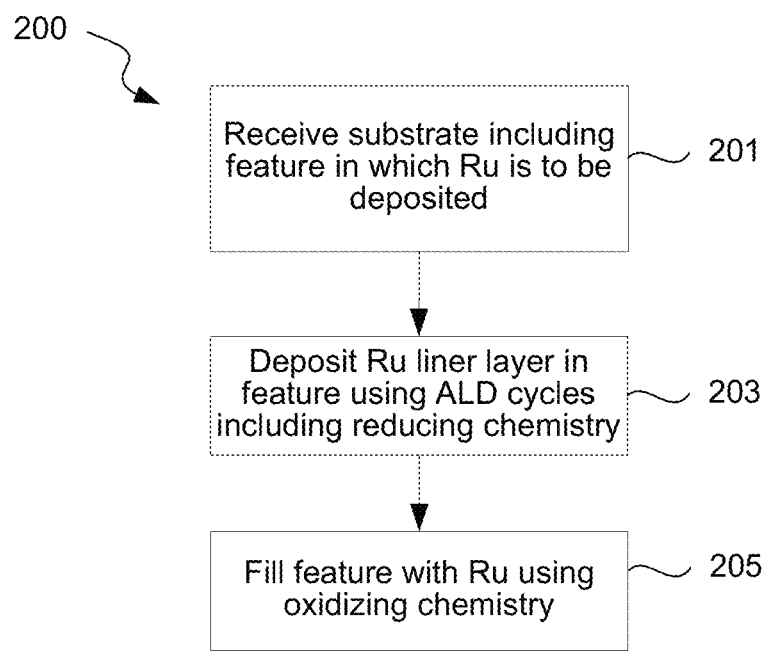
FIG. 2 is an example of a process flow diagram illustrating certain operations in depositing ruthenium in a feature according to certain embodiments.

FIG. 2 is a process flow diagram illustrating certain operations in depositing ruthenium in a feature. A method 200 may begin with receiving a substrate including a feature in which ruthenium is to be deposited. Block 201. An example of such a feature is shown in FIG. 1. In some embodiments, the feature may include an exposed dielectric sidewall surface and an exposed conductive surface. In some embodiments, the feature may include one or more previously deposited liner layers such as an adhesion layer or barrier layer. Such liner layers may be conformally or non-conformally deposited in the feature. In some embodiments, the feature may not contain any previously deposited liner layer. The feature to be filled with ruthenium may be of any appropriate part of a partially fabricated semiconductor device, including a source/drain (S/D) connection, an MOL structure or a BEOL structure.

Next, a Ru liner layer is deposited in the feature. Block 203. This is performed by an atomic layer deposition (ALD) method, which may be a thermal atomic layer deposition (tALD) method or a plasma-enhanced atomic layer deposition (PEALD) method. ALD is a surface-mediated deposition technique in which doses of ruthenium precursor and a reactant may be sequentially introduced into the deposition chamber. In a PEALD method, a plasma is ignited during one or more of the doses. In many embodiments, a plasma is ignited during the reactant dose. Multiple ALD cycles of the sequential doses are used to deposit a film.

Generally an ALD cycle is the minimum set of operations used to perform a surface deposition reaction one time. The result of one cycle is production of at least a partial Ru-containing film layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. A cycle contains one instance of a unique sequence of operations. As an example, an ALD cycle may include the following operations: (i) delivery/adsorption of a Ru-containing precursor, (ii) purging of Ru-containing precursor from the chamber, (iii) delivery of a second reactant with or without plasma, and (iv) purging of the reactant with or without plasma from the chamber. In another example ALD cycle, there may be (i) delivery/adsorption of a Ru-containing precursor, (ii) purging of Ru-containing precursor from the chamber, (iii) delivery/adsorption or reaction of an oxidant; (iv) delivery and reaction of a reductant; and (iv) purging of oxidant, reductant, and/or byproduct from the chamber. Further examples are described below with respect to FIG. 4A-4G.

Returning to FIG. 2, block 203 involves a reducing chemistry to deposit the Ru liner, either as a reactant in a Ru deposition cycle or as a treatment in the deposition cycle. As described above, the Ru liner layer is a protective layer that protects against oxidation of the underlying metal layers in subsequent operations. Examples of ALD dose sequences that may be employed during operation 203 include Ru precursor→reductant; Ru precursor→oxidant→reductant; Ru precursor→oxidant mixed with reductant; oxidant→Ru precursor→reductant; oxidant mixed with reductant→Ru precursor, etc. The "→" indicates a sequence of two doses. According to various embodiments, there may or may not be a purge between any two doses.

Figure 3A:
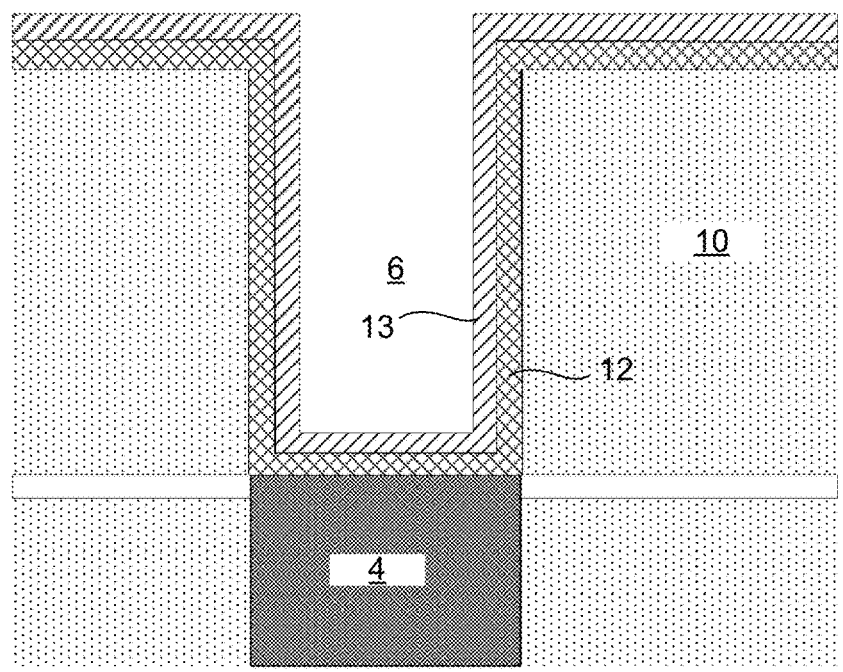
FIG. 3A is a schematic example of an unfilled feature after deposition of a Ru liner layer using a reducing chemistry according to certain embodiments.

FIG. 3A is an example of an unfilled feature 6 after deposition of a Ru liner layer 13 using a reducing chemistry. By using a reducing chemistry, oxidation of the underlying liner layer 12 and the underlying conductive material 4 is prevented. The thickness of the Ru liner layer may be, for example, 1-2 nm.

Figure 3B:
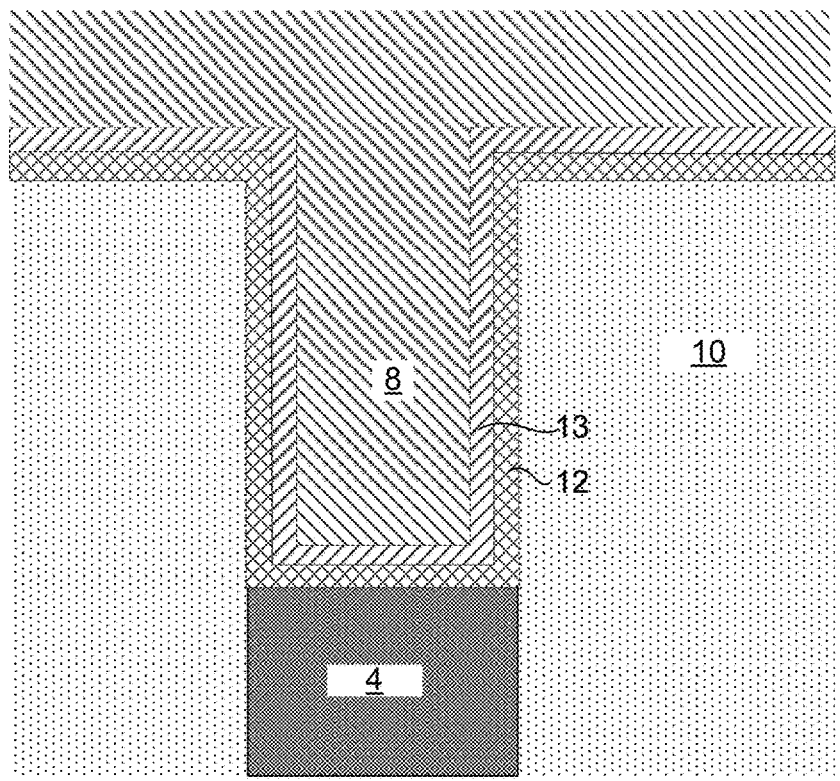
FIG. 3B is a schematic example of a filled feature including a Ru liner layer according to certain embodiments.

Once the Ru liner layer is deposited, the feature is filled using an oxidizing chemistry. Block 205. This may involve an ALD or a CVD (chemical vapor deposition) method. In some applications, the Ru filling may be achieved by methods of electrochemical plating (ECP) or electroless plating, especially for large features (e. g. dual damascene features of large dimensions). Because the Ru liner is present, operation 205 may proceed without use of a reducing chemistry. FIG. 3B illustrates the feature in FIG. 3A after fill, with Ru interconnect 8.

FIGS. 4A-4D illustrate examples of methods that may be used to perform blocks 203 and 205. In the method depicted in FIG. 4A, the liner layer is deposited in an ALD method that employs m cycles of Ru precursor dose/oxidant dose/reductant dose, where "/" represents a purge step with an inert gas such as Ar. The sequence of Ru precursor dose, oxidant dose, and reductant dose in ALD cycles may be varied and is not limited to the particular example described above.

In the depicted embodiment, the Ru precursor dose is first, followed by an oxidant dose. However, an ALD cycle may also begin with an oxidant dose, for example. An example of deposition mechanism from $O_2$ treatment followed by cycles of Ru precursor dose/oxidant dose is described in N. Leick et al. Chem. Mater., 2012, 24 (19), pp 3696-3700. First, $O_2$ is adsorbed on a surface to start the ALD cycle. A pulse of an appropriate Ru precursor is then used, with a ligand combustion reaction with adsorbed oxygen on surface to form a monolayer of ruthenium. An $O_2$ pulse results in combustion of the remaining carbon species. This is an example of a possible oxidative ALD Ru deposition, with other mechanisms and/or oxidation chemistries also possible. An example of a $Ru/O_2/H_2$ sequence may be found in J. Lu et al., Chem. Mater. 2015, 27, 4950-4956.

Regardless of the mechanism of oxidative deposition of ruthenium, hydrogen provided in a subsequent $H_2$ dose reacts with oxygen remaining in the structure, forming $H_2O$, which can be removed into vacuum. The next cycle begins with an $O_2$ dose to treat the surface and prepare it for the next Ru precursor dose. The $H_2$ may be a thermal or plasma dose. In some embodiments, the $H_2$ dose may be omitted in some cycles, e.g., it may be performed only every other cycle or every third cycle.

As noted above, the sequence of Ru precursor dose, oxidant dose, and reductant dose in ALD cycles may be varied and is not limited to the particular examples described above. The ALD cycle in FIG. 4A may be characterized as an oxidative deposition mechanism followed by a reaction with remaining oxidant with the reductant for removal.

Once the Ru liner layer is deposited, in some embodiments, n cycles of a Ru precursor dose and an oxidant dose are performed to fill the feature in an ALD process. In other embodiments, the Ru fill is performed by a CVD method in which the Ru precursor and $O_2$ or other oxidant is transported onto the surface simultaneously to deposit Ru films and then to fill features. The same or different Ru precursor may be used for both the Ru liner and the Ru fill. In some embodiments, Ru fill by ALD and CVD methods will be followed by Ru plating processes such as ECP and electroless plating to fill other large features.

Figure 4A:
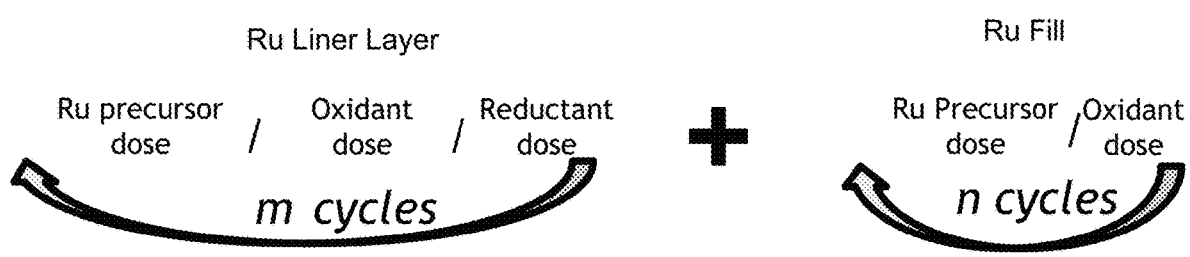
FIGS. 4A-4D illustrate examples of methods that may be used to perform blocks 203 and 205 of FIG. 2 according to certain embodiments.
Figure 4B:
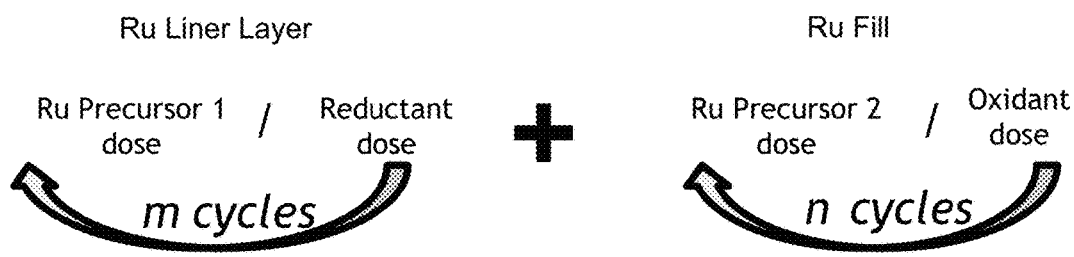

In the method of FIG. 4B, an ALD method employs m cycles of Ru precursor/reductant with the Ru precursor being reduced rather than oxidized. Once the Ru liner layer is deposited, in some embodiments, n cycles of a second Ru precursor and $O_2$ are performed to fill the feature. In other embodiments, the Ru fill is performed by a CVD method in which a second Ru precursor and $O_2$ or other oxidizers are transported onto the surface simultaneously to deposit Ru films and then to fill features. In this method, it may be advantageous to use different Ru precursors may be used for blocks 203 and 205 of FIG. 2. As explained below, the choice of Ru precursor may depend on whether the Ru liner deposition reaction is an oxidative or reducing reaction. Certain precursors may be used for both reductive and oxidative reactions and thus may be used for both operations of FIG. 4B.

Figure 4C:
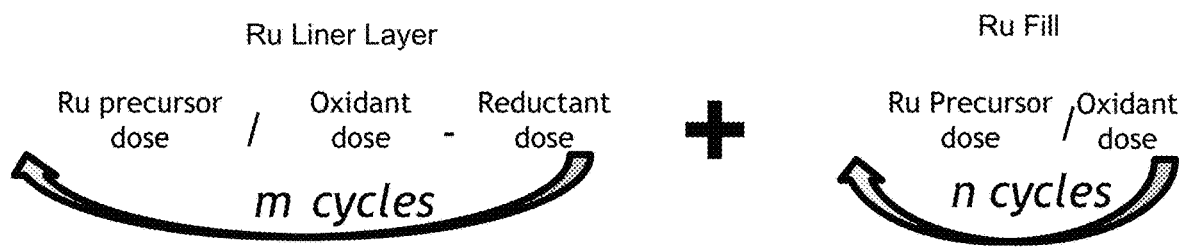

In the method of FIG. 4C, the liner layer is deposited in an ALD method that employs m cycles of Ru precursor dose/oxidant dose-reductant dose, where "/" represents a purge step with an inert gas such as Ar and the "-" represents a sequence without a purge step. The method in FIG. 4C is similar to that of certain embodiments of FIG. 4A with the exception of the lack of a purge between the oxidant and reductant. Once the Ru liner layer is deposited, in some embodiments, n cycles of a Ru precursor dose and an oxidant dose are performed to fill the feature in an ALD process.

Figure 4D:
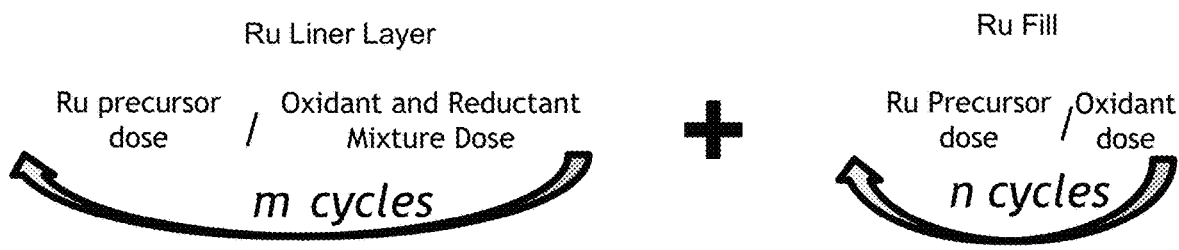

In the method of FIG. 4D, the liner layer is deposited in an ALD method that employs m cycles of Ru precursor dose/oxidant-reductant mixture dose. Once the Ru liner layer is deposited, in some embodiments, n cycles of a Ru precursor dose and an oxidant dose are performed to fill the feature in an ALD process.

The Ru precursors that are employed in the methods described herein are organometallic compounds. The particular Ru precursor employed may depend on if the Ru liner deposition reaction is an oxidative (FIGS. 4A, 4C, and 4D) or reducing (FIG. 4B) reaction. The reactant also depends on the type of reaction. For oxidative reactions, an oxygen-containing reactant is used, with diatomic oxygen ($O_2$), ozone ($O_3$) and water ($H_2O$) being examples. For reducing reactions, $H_2$ or $NH_3$ are examples of reductants (also referred to as reducing agents).

Most organometallic Ru precursors regardless of oxidation states readily react thermally with $O_2$ to give pure Ru films. Examples of Ru precursors that may be used for oxidative reactions include (ethylbenzyl)(1-ethyl-1,4-cyclohexadienyl)Ru(0), (1-isopropyl-4-methylbenzyl)(1,3-cyclohexadienyl)Ru(0), 2,3-dimethyl-1,3-butadienyl)Ru(0)tricarbonyl, (1,3-cyclohexadienyl)Ru(0)tricarbonyl, and (cyclopentadienyl)(ethyl)Ru(II)dicarbonyl, and but the choice of Ru precursors are not limited in these classes of compounds.

Ru precursors that react with non-oxidizing reactants may have positive oxidation states, typically +2 (i.e., Ru(2+) precursors, also referred to as Ru(II) precursors). Precursors that have Ru centers having non-zero oxidative states of +1 and +3 may also be used. Examples of Ru precursors that react with non-oxidizing reactants are bis(5-methyl-2,4-hexanediketonato)Ru(II)dicarbonyl and bis(ethylcyclopentadienyl)Ru(II) but the choice of Ru precursors is not limited in these classes of compounds. In particular, bis(ethylcyclopentadienyl)Ru(II) reacts with $NH_3$ in PEALD reactions.

Notably, (1-isopropyl-4-methylbenzyl)(1,3-cyclohexadienyl)Ru(0) may also be used in a reducing reaction (PEALD with $NH_3$) as well as in a tALD reaction with $O_2$. As such, the precursor could be used in a reducing reaction to form the Ru liner layer followed by an oxidative reaction for fill.

Further examples of Ru(0) and Ru(II) precursors that may be employed are given below in Table 1.

TABLE 1

Examples of Ru(0) and Ru(II) precursors

| Ru Precursor Formula | Examples |
| --- | --- |
| (arene)(diene)Ru(0) | (ethylbenzene)(1-ethyl-1,4-cyclohexadiene)Ru(0), (1-isopropyl-4-methylbenzene)(1,3-cyclohexadiene)Ru(0) |
| (arene)(triene)Ru(0) | (benzene)(1,3,5-cycloheptatriene)Ru(0) |
| (diene)(CO)$_3$Ru(0) | (2,3-dimethyl-1,3-butadienel)Ru(0)tricarbonyl, (1,3-cyclohexadiene)Ru(0)tricarbonyl |
| (triene)(CO)$_3$Ru(0) | (1,3,5-cycloheptatriene)Ru(0)tricarbonyl |
| (cyclopentadieny)(CO)$_2$(R)Ru(II) | (cyclopentadienyl)(ethyl)Ru(II)dicarbonyl |
| (cyclopentadienyl)$_2$Ru(II) | bis(ethylcyclopentadienyl)Ru(II) |
| (pentadienyl)($\eta^5$-cyclopentadienyl)Ru(II) | (2,4-dimethylpentadienyl)(ethylcyclopentadienyl)Ru(II) |
| (pentadienyl)$_2$Ru(II) | bis(2,4-dimethylpentadienyl)Ru(II) |
| (diketonate)$_2$(CO)$_2$Ru(II) | bis(2,4-pentanediketonato)Ru(II)dicarbonyl |
| (amidinate)$_2$(CO)$_2$Ru(II) | (N,N'-di-isopropylacetamidinato)Ru(II)dicarbonyl | arene is a neutral coordinating ligand, elemental composition of which is $C_6H_xR_y$, where x is 0, 1, 2, 3, 4, 5, or 6; wherein, y is 0, 1, 2, 3, 4, 5, or 6; wherein each R, independent of other R's, is a functional group independently selected from the group consisting of hydrogen, alkyl, haloalkyl, aryl, heteroaryl, trialkylsilyl, alkynyl, and amide
diene is a neutral coordinating ligand that has two carbon-carbon double bonds in the molecular structure and two double carbon-carbon double are bound to the Ru center, where the diene backbone has functional groups independently selected from the group consisting of hydrogen, alkyl, haloalkyl, aryl, heteroaryl, trialkylsilyl, alkynyl, and amide
triene is a neutral coordinating ligand that has three carbon-carbon double bonds in the molecular structure, and two double carbon-carbon double are bound to the Ru center, where the triene backbone has functional groups independently selected from the group consisting of hydrogen, alkyl, haloalkyl, aryl, heteroaryl, trialkylsilyl, alkynyl, and amide
cyclopentadienyl is a mono-anionic ligand that has closed 5-membered carbon ring in the molecular structure, where the cyclopentadienyl backbone has functional groups independently selected from the group consisting of hydrogen, alkyl, haloalkyl, aryl, heteroaryl, trialkylsilyl, alkynyl, and amide
pentadienyl is a mono-anionic ligand that has un-closed, linear 5-membered carbon chain in the molecular structure, where the pentadienyl backbone has functional groups independently selected from the group consisting of hydrogen, alkyl, haloalkyl, aryl, heteroaryl, trialkylsilyl, alkynyl, and amide
diketonate is a mono-anionic ligand, elemental composition of which is $R^1COCHCOR^2$, where $R^1$ and $R^2$ are functional groups independently selected from hydrogen, alkyl, haloalkyl, aryl, heteroaryl, trialkylsilyl and alkynyl.
amidinate is a mono-anionic ligand, elemental composition of which is $R^1NCR^2NR^3$, where $R^1$, $R^2$, and $R^3$ are functional groups independently selected from hydrogen, alkyl, haloalkyl, aryl, heteroaryl, trialkylsilyl and alkynyl.

In some embodiments, a Ru seed layer may be deposited on the Ru liner layer using an oxidant co-reactant. For example, one of the following sequences may be employed for feature fill:
Sequence 1:
Preclean Substrate
Deposit WCN or Other Adhesion Layer
Thermal ALD of Ru liner using non-oxidizing reactant (e.g., (2,4-dimethylpentadienyl)(ethylcyclopentadienyl)Ruthenium(II))
Thermal ALD of Ru seed using oxidizing reactant (e.g., (2,4-dimethylpentadienyl)(ethylcyclopentadienyl)Ruthenium(II))
CVD of Ru using oxidizing reactant (e.g., (ethylbenzyl)(1-ethyl-1,4-cyclohexadienyl)Ru(0))
Sequence 2:
Preclean Substrate
Deposit WCN or Other Adhesion Layer
PEALD of Ru liner using non-oxidizing reactant (e.g., (1-isopropyl-4-methylbenzyl)(1,3-cyclohexadienyl)Ru(0))
Thermal ALD of Ru seed using oxidizing reactant (e.g., (1-isopropyl-4-methylbenzyl)(1,3-cyclohexadienyl)Ru(0))
CVD of Ru using oxidizing (e.g., (1-isopropyl-4-methylbenzyl)(1,3-cyclohexadienyl)Ru(0))

In some embodiments, the Ru liner layer functions as a seed layer, without an additional layer deposited prior to gap fill. In some embodiments, the methods may be used to deposit ruthenium in features of varying sizes. In some such cases, all of the vias, trenches, or other features may be filled with ruthenium by ALD or CVD. In some other embodiments, Ru fill may be use for full fill of only small vias and trenches, with larger features being partially filled after the Ru fill of the smaller features ALD or CVD fill. These larger features may be filled with different metals other than ruthenium, and may be filled with non-vapor-deposition methods other than ALD and CVD, or by vapor deposition methods. For example, a large feature may be filled by: protective Ru layer deposition-Ru partial fill-full fill using a different method and/or metal. The methods for the final full fill can be ALD, CVD, electrochemical plating and electroless plating. The materials for the final full fill can be Ru, copper (Cu), tungsten (W), cobalt (Co), molybdenum (Mo), nickel (Ni), and aluminum (Al).

As indicated above, deposition of the Ru liner layer may proceed using an oxidative chemistry (with a reducing operation) or a non-oxidative chemistry. It also may be performed using PEALD or thermal ALD. Factors to consider in using ALD or PEALD and a oxidative or reducing chemistry include oxygen content at the interface of the underlying film, throughput, and step coverage. In some embodiments, if using a reducing chemistry (as for example in FIG. 4B), PEALD is employed to improve throughput with thermal ALD with a reducing chemistry being slow. Further, a reducing operation after an oxidizing chemistry (as in FIGS. 4A, 4C, and 4D) may advantageously use a plasma. In other embodiments, however, the reducing operation may be thermal to improve step coverage. If using an oxidizing operation (as for example in FIGS. 4A, 4C, and 4D), the substrate may be exposed to the oxidant in a thermal, non-plasma operation. This will reduce oxygen content at the interface and improve step coverage. While a reducing chemistry as in FIG. 4B may be useful to minimize oxidation, in some embodiments, the throughput and/or step coverage may be insufficient. Accordingly, one of the processes shown in FIG. 4A, 4C, or 4D may be used to balance oxygen content, throughput, and step coverage.

Figure 4E:
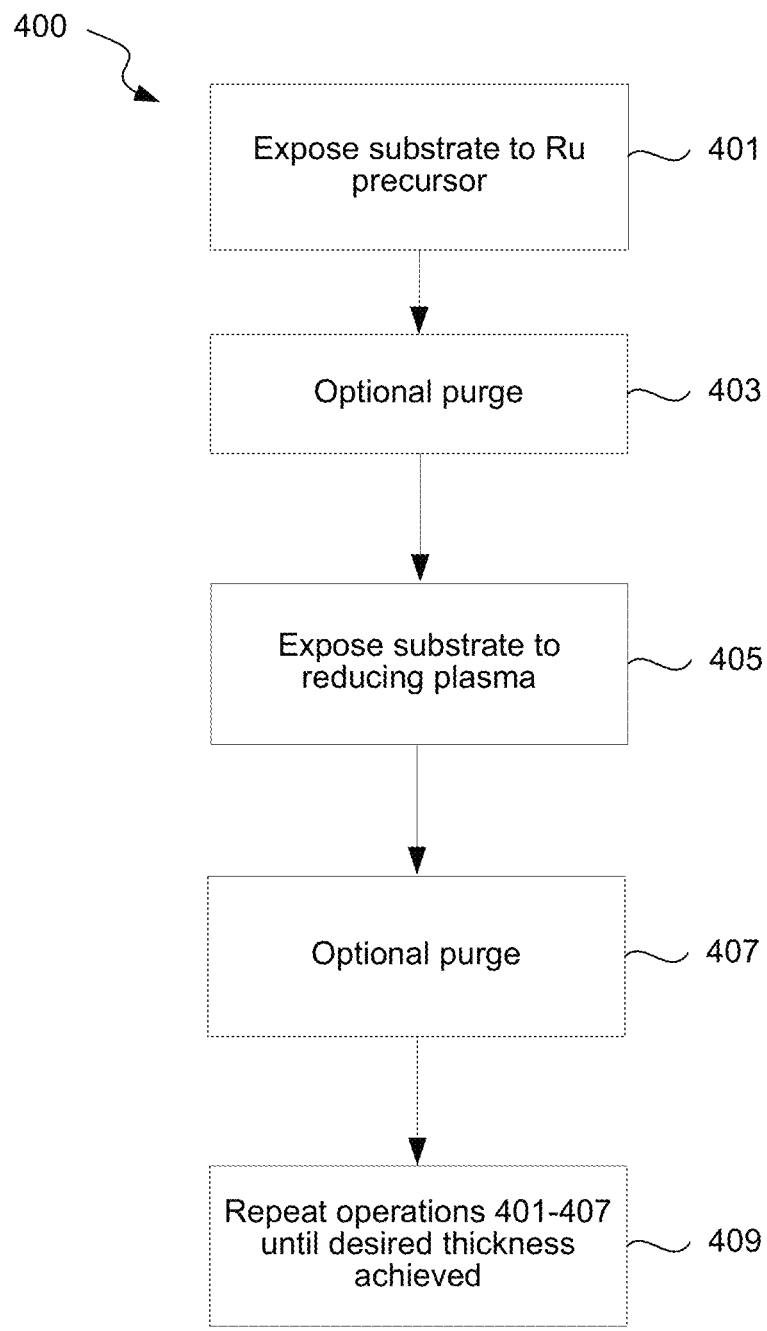
FIGS. 4E-4G are examples of process flow diagrams of ALD processes to deposit a Ru liner layer according to certain embodiments.
Figure 4F:
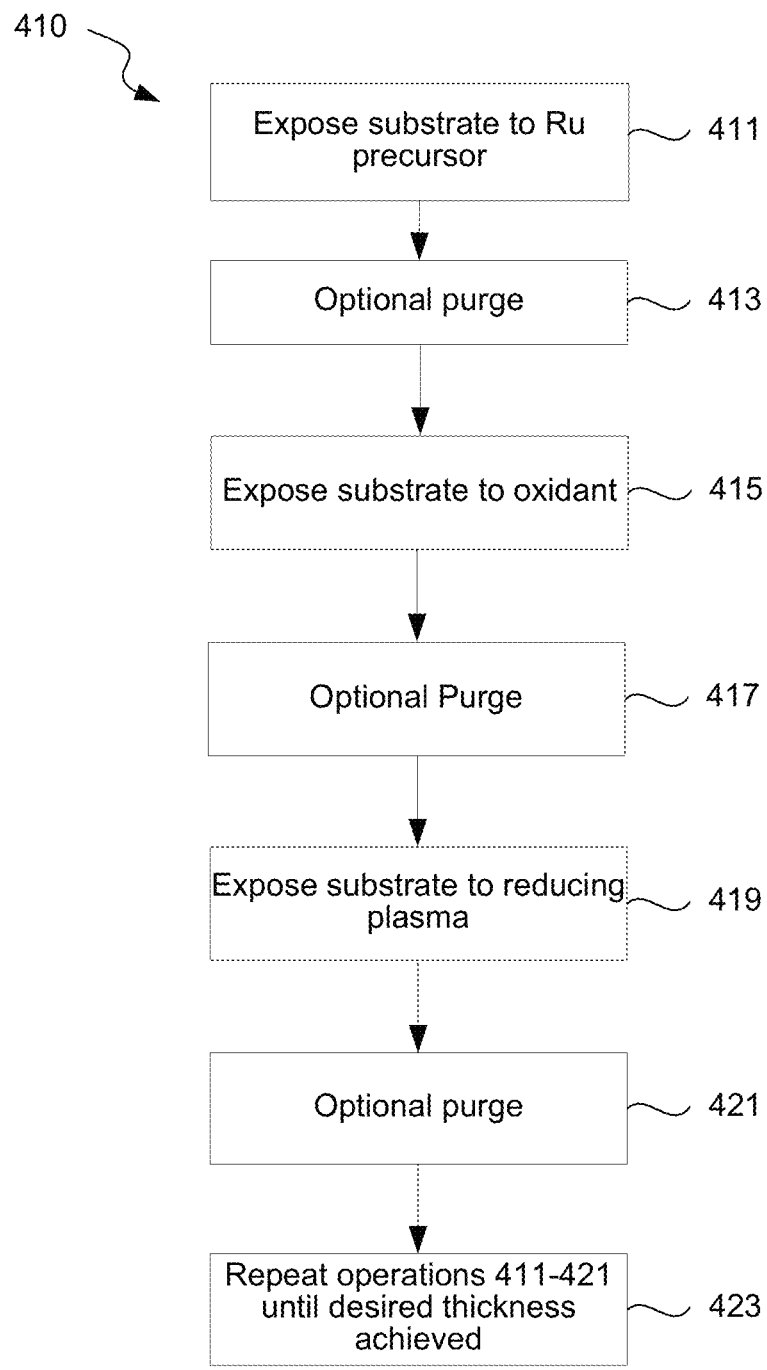
Figure 4G:
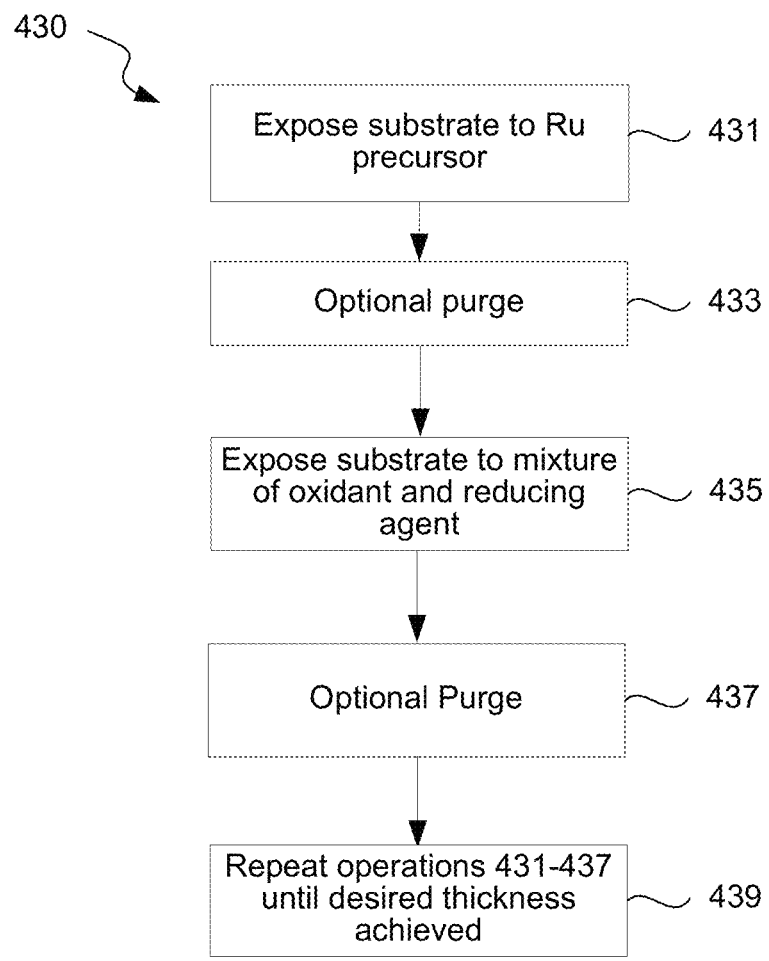

FIGS. 4E-4G provide examples of ALD processes to deposit a Ru liner layer according to various embodiments. First, turning to FIG. 4E, an example of a PEALD method of depositing a Ru liner using a reducing chemistry is shown. The method 400 begins with exposing a substrate to a Ru precursor. (401) According to various embodiments, the Ru precursor may be a Ru(II) precursor as described above. Alternatively, Ru(0) precursor that reacts with reducing agents such as (1-isopropyl-4-methylbenzyl)(1,3-cyclohexadienyl)Ru(0) may be employed. Example substrate temperatures during operation 401 range from 150° C. to 450° C., and in some embodiments from 200° C. to 400° C. Example chamber pressures range from 0.1 Torr to 10 Torr, and in some embodiments, from 0.5 Torr to 5 Torr. The Ru precursor may be delivered using a carrier gas such as argon (Ar), with example carrier gas flow rates of 25 sccm to 1000 sccm, and in some embodiments, 100 sccm to 500 sccm. Example precursor dose times may range from 0.5 seconds to 20 seconds and in some embodiments, from 2 seconds to 7 seconds. It is understood that the dose time, chamber, pressure, carrier gas flow, Ru concentration, and temperature may all be varied appropriately to expose the feature or features to sufficient Ru precursor to form an adsorbed saturated or sub-saturated layer and/or react with co-reactant. The method may then proceed with an optional purge. (403). During a purge, an inert gas such as Ar may be introduced to the chamber to remove Ru precursor that still remains in the vapor phase. Example purge times, if performed, are 0.1 seconds to 10 seconds, and in some embodiments, 0.5 seconds to 5 seconds. The substrate is then exposed to a reducing plasma. (405). The plasma may be generated from a process gas containing a reducing agent compound such as hydrogen ($H_2$) or ammonia ($NH_3$). Other compounds such as hydrazine ($N_2H_2$) may be used. The selection of reducing agent may depend on the Ru precursor employed in some embodiments. A carrier gas and flow rate as described with reference to operation 401 may be employed throughout the process. In some embodiments, an RF generator may be used to generate the plasma. Example RF powers are between 50 W and 700 W, and in some embodiments between 200 W and 550 W. Example dose times are less than 20 seconds, and in some embodiments, between 1 and 7 seconds. An optional purge may be performed. (407). Example purge times, if performed, are 0.1 seconds to 10 seconds, and in some embodiments, 0.5 seconds to 5 seconds. Operations 401-407 may then be repeated until a desired thickness is achieved. (409).

In FIG. 4F, an example of an ALD method of depositing a Ru liner using an oxidizing chemistry is shown. The method 410 begins with exposing a substrate to a Ru precursor. (411) According to various embodiments, the Ru precursor may be a Ru(0) precursor as described above, though Ru(II) precursors may be used in some embodiments. Example substrate temperatures during operation 411 range from 150° C. to 450° C., and in some embodiments from 200° C. to 400° C. Example chamber pressures range from 0.1 Torr to 10 Torr, and in some embodiments, from 0.5 Torr to 5 Torr. The Ru precursor may be delivered using a carrier gas such as argon (Ar), with example carrier gas flow rates of 25 sccm to 1000 sccm, and in some embodiments, 100 sccm to 500 sccm. The carrier gas may be used throughout the process. Example precursor dose times may range from 0.5 seconds to 20 seconds and in some embodiments, from 2 seconds to 15 seconds. It is understood that the dose time, chamber, pressure, carrier gas flow, Ru concentration, and temperature may all be varied appropriately to expose the feature or features to sufficient Ru precursor to form an adsorbed saturated or sub-saturated layer and/or react with co-reactant. The method may then proceed with an optional purge. (413). During a purge, an inert gas such as Ar may be introduced to the chamber to remove Ru precursor that still remains in the vapor phase. Example purge times, if performed, are 0.1 seconds to 10 seconds, and in some embodiments, 0.5 seconds to 5 seconds.

The substrate is then exposed to an oxidant. (415). In the example of FIG. 4F, the oxidant is provided in a thermal (non-plasma) exposure. Examples of oxidants include $O_2$, water $H_2O$, and carbon dioxide ($CO_2$). The selection of oxidant may depend on the Ru precursor employed in some embodiments. A carrier gas and flow rate as described with reference to operation 411 may be employed. Example dose times are less than 20 seconds, and in some embodiments, between 0.2 and 5 seconds. An optional purge may be performed. (417). Example purge times, if performed, are 0.1 seconds to 10 seconds, and in some embodiments, 0.5 seconds to 5 seconds. The substrate is then exposed to a reducing plasma (419). The plasma may be generated from a process gas containing a reducing agent compound such as hydrogen ($H_2$) or ammonia ($NH_3$). Other compounds such as hydrazine ($N_2H_2$) may be used. A carrier gas and flow rate as described above may be employed. In some embodiments, an RF generator may be used to generate the plasma. Example RF powers are between 50 W and 700 W, and in some embodiments between 200 W and 550 W. Example dose times are less than 20 seconds, and in some embodiments, between 0.2 and 5 seconds. An optional purge may be performed. (421). Example purge times, if performed, are 0.1 seconds to 10 seconds, and in some embodiments, 0.1 seconds to 5 seconds. Operations 411-421 may then be repeated until a desired thickness is achieved. (423). As described further below, while purge operations may be generally performed between the Ru precursor and subsequent reactant and prior to the next Ru precursor dose, in certain embodiments, there is no purge between the oxidant and the reducing plasma. That is, the purge operation 417 may be advantageously omitted in some embodiments, even as the purges in operations 413 and 423 may be performed.

In FIG. 4G, an example of a purely thermal ALD method of depositing a Ru liner is shown. The method 430 begins with exposing a substrate to a Ru precursor. (431) According to various embodiments, the Ru precursor may be a Ru(0) precursor as described above though Ru(II) precursors may be used in some embodiments. Example substrate temperatures during operation 431 range from 150° C. to 450° C., and in some embodiments from 200° C. to 400° C. Example chamber pressures range from 0.1 Torr to 10 Torr, and in some embodiments, from 0.5 Torr to 5 Torr. The Ru precursor may be delivered using a carrier gas such as argon (Ar), with example carrier gas flow rates of 25 sccm to 1000 sccm, and in some embodiments, 100 sccm to 500 sccm. The carrier gas may be used throughout the process. Example precursor dose times may range from 0.5 seconds to 20 seconds and in some embodiments, from 2 seconds to 15 seconds. It is understood that the dose time, chamber, pressure, carrier gas flow, Ru concentration, and temperature may all be varied appropriately to expose the feature or features to sufficient Ru precursor to form an adsorbed saturated or sub-saturated layer and/or react with a co-reactant. An optional purge may be performed. (433). Example purge times, if performed, are 0.1 seconds to 10 seconds, and in some embodiments, 0.5 seconds to 5 seconds. The substrate is then exposed to a mixture of an oxidant and a reducing agent, e.g., an $O_2/H_2$ mixture. (435). Examples of $O_2/H_2$ volumetric flow ratios mixture range from 1% to 6%. Other reducing agents may be used similarly to provide dilute $O_2$ flows.

The oxidant may react with adsorbed Ru precursor to form a layer of Ru using an oxidative mechanism, with the reducing agent effective at lowering the oxygen content of the resulting film. A carrier gas may be employed as described above. Example dose times are less than 20 seconds, and in some embodiments, between 0.2 and 5 seconds. An optional purge may be performed. (437). Example purge times, if performed, are 0.1 seconds to 10 seconds, and in some embodiments, 0.1 seconds to 5 seconds. Operations 431-435 may then be repeated until a desired thickness is achieved. (439).

Experimental

Ru liner layers (about 2 nm thick) were deposited on WCN films using five different ALD processes as described below:

Process 1 is an example of a process according to FIG. 4E, with multiple Ru(II) precursor-purge-reducing agent-purge cycles.

Process 2 is a process without any reducing agent, with multiple Ru(0)-purge-oxidant-purge cycles.

Process 3 is an example of a process according to FIG. 4F, with multiple Ru(0)-purge-oxidant-purge-reducing plasma-purge cycles.

Process 4 is another example of a process according to FIG. 4F, with no purge between the oxidant and reducing plasma doses, i.e., multiple Ru(0)-purge-oxidant-reducing plasma-purge cycles.

Process 5 is an example of a process according to FIG. 4G, with multiple Ru(0)-purge-oxidant+reducing agent-purge cycles.

The same Ru(0) precursor was used for processes 2-5. In all processes, the reducing agent was $H_2$ and oxidant was $O_2$. A direct $Ar/H_2$ plasma was used for the processes indicated reductant (plasma).

The films were analyzed for oxygen percentage (0%) at the 1) the Ru/WCN interface and 2) in the Ru liner layer by SIMS/XPS and for tungsten oxide ($WO_3$) thickness at the Ru/WCN interface using ARXPS. The results are shown in Table 2.

| Metric | Process 1: Precursor 1/ reductant (plasma) | Process 2: Precursor 2/ oxidant | Process 3: Precursor 2/ oxidant/ reductant (plasma) | Process 4: Precursor 2/ oxidant reductant (plasma) | Process 5: Precursor 2/ (oxidant + reductant) |
|---|---|---|---|---|---|
| O at % at Ru/WCN | <0.05 | about 8 | about 3 | <1 | about 6 |
| O at % in Ru film | <0.05 | <0.1 | <0.1 | <0.1 | <0.1 |
| $WO_3$ thickness (Angstrom) at Ru/WCN | 0 | 4.1 | 1.0 | 0.6 | N/A |

The process without a reducing agent (process 2) resulted in the most oxygen at the Ru/WCN interface and a relatively thick $WO_3$ layer. Comparing process 4 and process 3, omitting a purge between the oxidant and reductant plasma resulted in reduced oxygen content at the interface.

Apparatus

Figure 5:
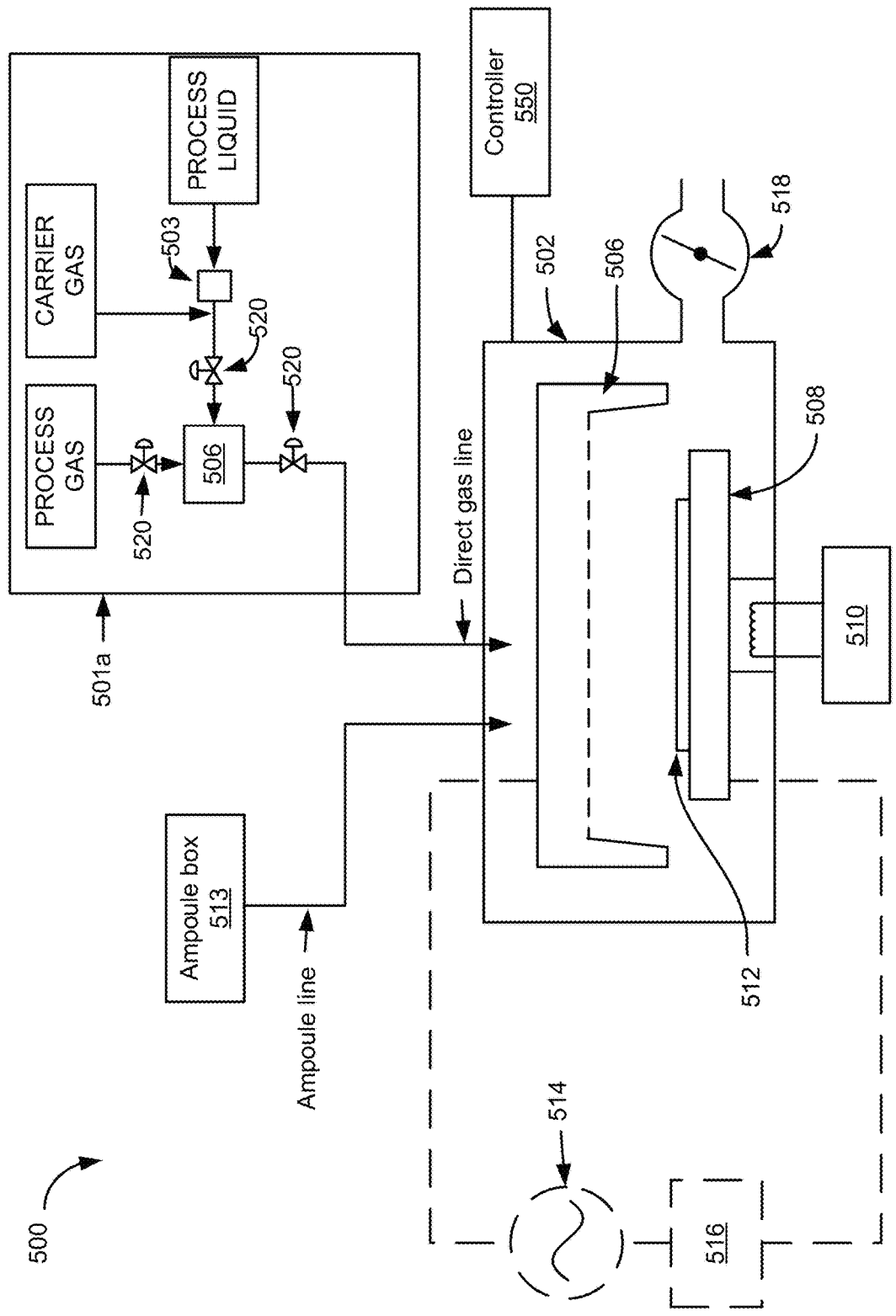
FIGS. 5 and 6 depict schematic illustrations of apparatuses that may be used to implement the methods described herein according to certain embodiments.
Figure 6:
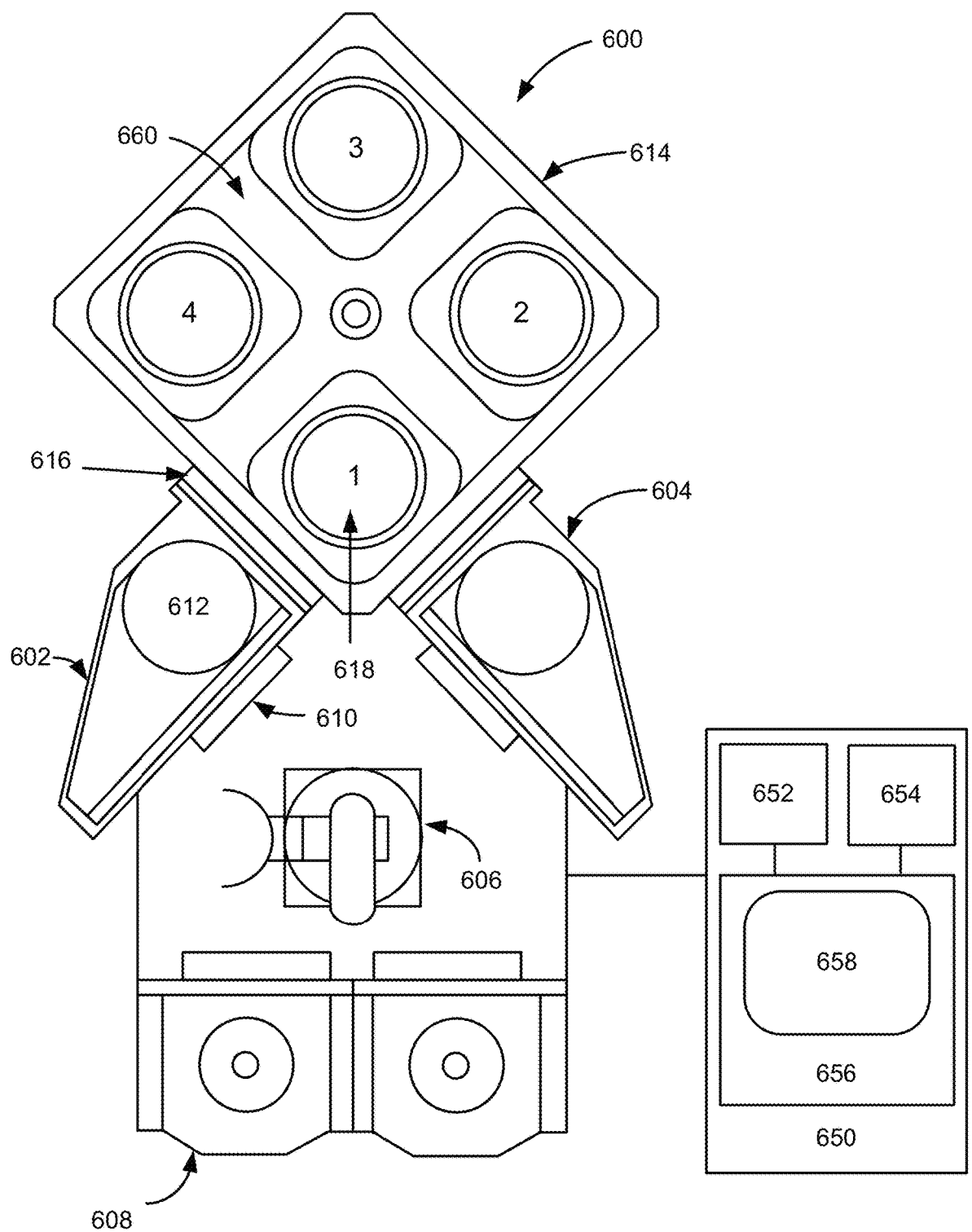

FIG. 5 depicts a schematic illustration of an embodiment of an ALD process station 500 having a process chamber 502 for maintaining a low-pressure environment. A plurality of ALD process stations may be included in a common low pressure process tool environment. For example, FIG. 6 depicts an embodiment of a multi-station processing tool 600. In some embodiments, one or more hardware parameters of ALD process station 500, including those discussed in detail below, may be adjusted programmatically by one or more computer controllers 550.

ALD process station 500 fluidly communicates with reactant delivery system 501a for delivering process gases to a distribution showerhead 506. Reactant delivery system 501a includes a mixing vessel 504 for blending and/or conditioning process gases, such as a Ru precursor-containing gas, a hydrogen-containing gas, or reactant-containing gas, for delivery to showerhead 506. One or more mixing vessel inlet valves 520 may control introduction of process gases to mixing vessel 504. In various embodiments, selective deposition of a Ru liner layer is performed in process station 500 and in some embodiments, other operations such as pre-treatment, Ru seed layer deposition, or Ru gap fill may be performed in the same or another station of the multi-station processing tool 500 as further described below with respect to FIG. 5.

As an example, the embodiment of FIG. 5 includes a vaporization point 503 for vaporizing liquid reactant to be supplied to the mixing vessel 504. In some embodiments, vaporization point 503 may be a heated vaporizer. In some embodiments, a liquid precursor or liquid reactant may be vaporized at a liquid injector (not shown). For example, a liquid injector may inject pulses of a liquid reactant into a carrier gas stream upstream of the mixing vessel 504. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 503. In one scenario, a liquid injector may be mounted directly to mixing vessel 504. In another scenario, a liquid injector may be mounted directly to showerhead 506.

In some embodiments, a liquid flow controller (LFC) upstream of vaporization point 503 may be provided for controlling a mass flow of liquid for vaporization and delivery to process chamber 502. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 506 distributes process gases toward substrate 512. In the embodiment shown in FIG. 5, the substrate 512 is located beneath showerhead 506 and is shown resting on a pedestal 508. Showerhead 506 may have any suitable shape, and may have any suitable number and arrangement of ports for distributing process gases to substrate 512.

In some embodiments, pedestal 508 may be raised or lowered to expose substrate 512 to a volume between the substrate 512 and the showerhead 506. In some embodiments, pedestal 508 may be temperature controlled via heater 510. Pedestal 508 may be set to any suitable temperature, such as between about 200° C. and about 400° C. during operations for performing various disclosed embodiments. It will be appreciated that, in some embodiments, pedestal height may be adjusted programmatically by a suitable computer controller 550. At the conclusion of a process phase, pedestal 508 may be lowered during another substrate transfer phase to allow removal of substrate 512 from pedestal 508.

In some embodiments, a position of showerhead 506 may be adjusted relative to pedestal 508 to vary a volume between the substrate 512 and the showerhead 506. Further, it will be appreciated that a vertical position of pedestal 508 and/or showerhead 506 may be varied by any suitable mechanism within the scope of the present disclosure. In some embodiments, pedestal 508 may include a rotational axis for rotating an orientation of substrate 512. It will be appreciated that, in some embodiments, one or more of these example adjustments may be performed programmatically by one or more suitable computer controllers 550. The computer controller 550 may include any of the features described below with respect to controller 550 of FIG. 6.

In some embodiments where plasma may be used as discussed above, showerhead 506 and pedestal 508 electrically communicate with a radio frequency (RF) power supply 514 and matching network 516 for powering a plasma. In some embodiments, the plasma energy may be controlled by controlling one or more of a process station pressure, a gas concentration, an RF source power, an RF source frequency, and a plasma power pulse timing. For example, RF power supply 514 and matching network 516 may be operated at any suitable power to form a plasma having a desired composition of radical species. Likewise, RF power supply 514 may provide RF power of any suitable frequency. In some embodiments, RF power supply 514 may be configured to control high- and low-frequency RF power sources independently of one another. Example low-frequency RF frequencies may include, but are not limited to, frequencies between 0 kHz and 900 kHz. Example high-frequency RF frequencies may include, but are not limited to, frequencies between 1.8 MHz and 2.45 GHz, or greater than about 13.56 MHz, or greater than 27 MHz, or greater than 80 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

The plasmas described above are direct plasmas. However, in some embodiments, a plasma generator that is remote to the processing chamber may be used with the resulting plasma delivered to the processing chamber.

In some embodiments, instructions for a controller 550 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., a Ru precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as $H_2$, $NH_3$, or $O_2$, instructions for modulating the flow rate of a carrier or purge gas, instructions for igniting a plasma, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the present disclosure.

Further, in some embodiments, pressure control for process station 500 may be provided by butterfly valve 518. As shown in the embodiment of FIG. 5, butterfly valve 518 throttles a vacuum provided by a downstream vacuum pump (not shown). However, in some embodiments, pressure control of process station 500 may also be adjusted by varying a flow rate of one or more gases introduced to the process station 500.

As described above, one or more process stations may be included in a multi-station processing tool. FIG. 6 shows a schematic view of an embodiment of a multi-station processing tool 600 with an inbound load lock 602 and an outbound load lock 604, either or both of which may include a remote plasma source (not shown). A robot 606, at atmospheric pressure, is configured to move wafers from a cassette loaded through a pod 608 into inbound load lock 602 via an atmospheric port 610. A wafer (not shown) is placed by the robot 606 on a pedestal 612 in the inbound load lock 602, the atmospheric port 610 is closed, and the load lock inbound 602 is pumped down. Where the inbound load lock 602 includes a remote plasma source, the wafer may be exposed to a remote plasma treatment in the inbound load lock 602 prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 614 includes four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, in some embodiments, a process station may be switchable between a thermal ALD process mode and a PEALD process mode. In some embodiments, exposure to a deposition precursor and exposure to a second reactant and plasma are performed in the same station. Additionally or alternatively, in some embodiments, processing chamber 614 may include one or more matched pairs of ALD and PEALD process stations. Further, exposure to a pre-treatment gas or plasma and an ALD process may occur in the same or different stations. While the depicted processing chamber 614 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 depicts an embodiment of a wafer handling system 660 for transferring wafers within processing chamber 614. In some embodiments, wafer handling system 660 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog, and/or digital input/output connections, stepper motor controller boards, etc.

In some embodiments, system controller 650 controls all of the activities of process tool 600. System controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, gas flow rates, chamber and/or station pressure, chamber and/or station temperature, plasma exposure duration, UV radiation duration, wafer temperature, target power levels, RF power levels, substrate pedestal, chuck and/or susceptor position, and other parameters of a particular process performed by process tool 600. System control software 658 may be configured in any suitable way. For example, various process tool component subroutines or control objects may be written to control operation of the process tool components used to carry out various process tool processes. System control software 658 may be coded in any suitable computer readable programming language.

In some embodiments, system control software 658 may include input/output control (IOC) sequencing instructions for controlling the various parameters described above. Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition (e.g., organo-tungsten compound-containing gases, co-reactant gases, gases for performing a pre-treatment, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 650 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 650.

In some implementations, the system controller 650 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 650, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 650 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 650 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 650, in some implementations, may be a part of or coupled to a computer that is integrated with, coupled to the system, otherwise networked to the system, or a combination thereof. For example, the system controller 650 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 650 receives instructions in the form of data, which specify parameters for each of the processing steps to be performed during one or more operations. It should be understood that the parameters may be specific to the type of process to be performed and the type of tool that the system controller 650 is configured to interface with or control.

Thus as described above, the system controller 650 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

While FIGS. 5 and 6 provide examples of chambers and tools that may be used to perform the methods disclosed herein, various modifications may be made. These include the use of any CCP or ICP plasma generator or the use of a remote plasma generator.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 650 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In the description above and in the claims, numerical ranges are inclusive of the end points of the range. For example, "carrier gas flow rates of 25 sccm to 1000 sccm" includes 25 sccm and 1000 sccm.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:
1. A method comprising:
  receiving a substrate including a feature;
  performing multiple atomic layer deposition (ALD) cycles to deposit a ruthenium (Ru) liner layer in the feature, wherein each of the ALD cycles include a dose of a reducing agent; and
  after depositing the Ru liner layer, at least partially filling the feature with ruthenium by reacting a first ruthenium precursor with an oxidant to form metallic ruthenium (Ru).
2. The method of claim 1, wherein each of the multiple ALD cycles comprises reacting a second ruthenium precur- sor with the reducing agent, the second ruthenium precursor being different than the first ruthenium precursor.

3. The method of claim 2, wherein the first ruthenium precursor has an oxidation state of 0 and the second ruthenium precursor has an oxidation state of +2.

4. The method of claim 1, wherein each of the multiple ALD cycles include reacting the first ruthenium precursor with the reducing agent.

5. The method of claim 1, where the feature includes a first liner layer on which the Ru liner is deposited.

6. The method of claim 1, wherein the ALD cycles are thermal ALD cycles.

7. The method of claim 1, wherein the ALD cycles are plasma enhanced ALD (PEALD) cycles.

8. The method of claim 1, wherein the reducing agent is $H_2$ or $NH_3$ or plasma species generated from $H_2$ or $NH_3$.

9. The method of claim 1, wherein the oxidant is $O_2$, $O_3$, or $H_2O$.

10. The method of claim 1, wherein each of the multiple ALD cycles comprises reacting the first ruthenium precursor with an oxidant.

11. The method of claim 10, wherein the dose of the reducing agent removes oxygen incorporated into the Ru liner layer or an underlying metallic layer.

12. The method of claim 1, wherein the feature is fully filled with ruthenium.

13. The method of claim 1, wherein the feature is fully filled with a metal selected from Ru, Cu, W, Co, Mo, Ni, and Al.

14. The method of claim 1, wherein each of the multiple ALD cycles comprises a ruthenium precursor dose followed by an oxidant dose.

15. The method of claim 14, wherein the ruthenium precursor dose and oxidant dose are non-plasma doses.

16. The method of claim 15, wherein each of the multiple ALD cycles comprises a reducing plasma dose after the oxidant dose.

17. The method of claim 16, wherein there is no purge between oxidant dose and the reducing plasma dose.

18. The method of claim 14, wherein the oxidant dose is a mixture of an oxidant and a reducing agent.

19. The method of claim 1, wherein the Ru liner layer is 2 nm or less.

20. The method of claim 1, wherein the Ru liner layer is deposited on a layer selected from tungsten carbon nitride (WCN), titanium nitride (TiN), tungsten nitride (WN), tungsten carbide (WC), and tantalum nitride (TaN).

21. The method of claim 1, wherein the first ruthenium precursor is an organometallic precursor.

22. The method of claim 1, wherein the first ruthenium precursor has an oxidation state of 0.

23. The method of claim 1, wherein the first ruthenium precursor has an oxidation state of +2.

24. The method of claim 1, wherein the first ruthenium precursor is reacted with an oxidant in an ALD process or a CVD process.

25. The method of claim 1, wherein the Ru liner layer is oxygen-free.

* * * * *